(12) United States Patent
Lee et al.

(10) Patent No.: US 9,263,507 B2
(45) Date of Patent: Feb. 16, 2016

(54) ORGANIC LIGHT-EMITTING DIODE (OLED) DISPLAY AND METHOD FOR MANUFACTURING THE SAME

(71) Applicant: Samsung Display Co., Ltd., Yongin, Gyeonggi-do (KR)

(72) Inventors: Wang Woo Lee, Osan-si (KR); Moo Soon Ko, Seoul (KR); Min Woo Woo, Bucheon-si (KR); Il Jeong Lee, Seoul (KR); Jeong Ho Lee, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/457,862

(22) Filed: Aug. 12, 2014

(65) Prior Publication Data

US 2015/0090980 A1 Apr. 2, 2015

(30) Foreign Application Priority Data

Sep. 27, 2013 (KR) .......................... 10-2013-0115350

(51) Int. Cl.
| | | |
|---|---|---|
| *H01L 27/11* | (2006.01) | |
| *H01L 27/32* | (2006.01) | |
| *H01L 27/12* | (2006.01) | |
| *H01L 29/786* | (2006.01) | |

(52) U.S. Cl.
CPC ........ *H01L 27/3262* (2013.01); *H01L 27/1259* (2013.01); *H01L 29/78621* (2013.01); *H01L 29/78645* (2013.01); *H01L 29/78675* (2013.01)

(58) Field of Classification Search
CPC ............ H01L 27/1229; H01L 27/1237; H01L 27/1281; H01L 27/1288; H01L 27/1296; H01L 29/78621; H01L 29/78675; H01L 29/78645
USPC .......................... 257/40, 59, 72, 88, E27.111
See application file for complete search history.

(56) References Cited

U.S. PATENT DOCUMENTS

| | | | | |
|---|---|---|---|---|
| 7,408,192 B2* | 8/2008 | Kang | .................. | H01L 27/3223 257/59 |
| 8,368,297 B2* | 2/2013 | Kim | .................. | H05B 33/26 257/88 |
| 2006/0157711 A1* | 7/2006 | Kang | .................. | H01L 27/1296 257/72 |
| 2008/0087889 A1* | 4/2008 | Chan | .................. | H01L 27/1229 257/40 |
| 2009/0262270 A1* | 10/2009 | Kim | .................. | G02F 1/136213 349/39 |
| 2014/0167040 A1* | 6/2014 | Lee | .................. | H01L 29/66969 257/43 |
| 2014/0225075 A1* | 8/2014 | Zhan | .................. | H01L 29/78672 257/40 |
| 2015/0102355 A1* | 4/2015 | Yang | .................. | H01L 27/1288 257/72 |
| 2015/0129870 A1* | 5/2015 | Hsin | .................. | H01L 21/428 257/43 |

FOREIGN PATENT DOCUMENTS

| | | |
|---|---|---|
| KR | 1998-023377 A | 7/1998 |
| KR | 10-0767612 B1 | 10/2007 |
| KR | 10-1258474 B1 | 4/2013 |

* cited by examiner

*Primary Examiner* — Michael Lebentritt
(74) *Attorney, Agent, or Firm* — Knobbe, Martens, Olson & Bear, LLP (57) ABSTRACT

An organic light-emitting diode (OLED) display having thin film transistors (TFTs) is disclosed. In one aspect, TFTs of the OLED display include a substrate and a first semiconductor layer formed over the substrate and including first channel, source, and drain regions and a lightly doped region between the first channel region and the first source and drain regions. The OLED display also includes a second semiconductor layer formed over the substrate and including second channel, source, and drain regions. The OLED display further includes first and second gate electrodes formed over the first semiconductor layer and a third gate electrode formed over the second semiconductor layer. The width of the second gate electrode is less than that of the first gate electrode and the lightly doped region overlaps a portion of the first gate electrode and does not overlap the second gate electrode.

11 Claims, 8 Drawing Sheets

ORGANIC LIGHT-EMITTING DIODE (OLED) DISPLAY AND METHOD FOR MANUFACTURING THE SAME

CROSS-REFERENCE TO RELATED APPLICATIONS

This application claims priority to and the benefit of Korean Patent Application No. 10-2013-0115350 filed in the Korean Intellectual Property Office on Sep. 27, 2013, the entire contents of which are incorporated herein by reference.

BACKGROUND

1. Field

The described technology generally relates to an organic light-emitting diode (OLED) display having thin film transistors and a manufacturing method thereof.

2. Description of the Related Technology

Active matrix OLED displays include a display panel including a plurality of pixels each including a thin film transistor (TFT) and an OLED. Images can be displayed on the OLED display by controlling the current flowing to each OLED using the corresponding thin film transistor.

SUMMARY OF CERTAIN INVENTIVE ASPECTS

One inventive aspect is an OLED display having a greater aperture ratio and a favorable characteristics in both on and off states by forming a lightly doped region near a channel region of a gate electrode by using a plurality of gate electrodes having different widths and a manufacturing method thereof.

Another aspect is an OLED display including a substrate, a first semiconductor layer including a first channel region, a first source region, a first drain region, and a lightly doped region between the first channel region and the first source and drain regions, and a second semiconductor layer including a second channel region and a second source region and second drain region, on the substrate, a gate insulating layer disposed on the first semiconductor layer, the second semiconductor layer, and the substrate, a first gate electrode disposed at a position corresponding to the first semiconductor layer on the gate insulating layer, a first interlayer insulating layer disposed on the first gate electrode and the gate insulating layer, and a second gate electrode disposed at a position corresponding to the first gate electrode on the first interlayer insulating layer and a third gate electrode disposed at a position corresponding to the second semiconductor layer, wherein the second gate electrode is formed with a narrower width than the first gate electrode, and the lightly doped region of the first semiconductor layer overlaps the first gate electrode does not overlap the second gate electrode.

The first channel region of the first semiconductor layer is formed at a position overlapping all of the first gate electrode and the second gate electrode and the first source region and the first drain region are formed at a position where the first gate electrode and the second gate electrode do not overlap.

A blocking film may be formed between the substrate and the first semiconductor layer and second semiconductor layer.

The first semiconductor layer may be doped with an impurity such as boron, gallium, phosphorus, arsenic, or combinations thereof.

The lightly doped region may be an offset region which includes a small amount of impurities.

The second channel region of the second semiconductor layer may be positioned overlapping the third gate electrode and the second source and second drain region may be positioned at a position where the third gate electrode is not overlapped.

The first gate electrode may be formed with a thickness of less than about 1000 Å.

The OLED display may further include a second interlayer insulating layer disposed on the second gate electrode and the third gate electrode, a data conductor disposed on the second interlayer insulating layer, a passivation layer disposed on the data conductor, a plurality of pixel electrodes and partitions disposed on the passivation layer, an organic light-emitting member disposed on the partition, and a common electrode disposed on the organic light-emitting member, wherein the second interlayer insulating layer and the gate insulating layer may have a plurality of contact holes exposing the source and drain regions to contact the data conductor and the passivation layer may have a plurality of contact holes exposing the data conductor to be connected to the pixel electrodes.

The first semiconductor layer, the first gate electrode, and the second gate electrode may form a switching thin film transistor connected to the data conductor and the second semiconductor layer and the third gate electrode may form a driving thin film transistor connected to the organic light-emitting member.

Another aspect is a method of manufacturing an organic light-emitting diode (OLED) display including forming a first semiconductor layer and a second semiconductor layer on a substrate, forming a gate insulating layer on the first semiconductor layer, the second semiconductor layer, and the substrate, forming a first gate electrode on the gate insulating layer corresponding to the first semiconductor layer, forming a first interlayer insulating layer on the first gate electrode and the gate insulating layer, forming a second gate electrode and a third gate electrode on the first interlayer insulating layer corresponding to the first gate electrode and the second semiconductor layer, and adding an impurity element to the first semiconductor layer and the second semiconductor layer to dope the semiconductor layer, wherein the second gate electrode is formed with a narrower width than the first gate electrode, the first semiconductor layer includes a first channel region, a first source region, a first drain region, and a lightly doped region positioned between the first channel region and the first source and drain regions, and the lightly doped region as a portion overlapping the first gate electrode does not overlap the second gate electrode.

Another aspect is an organic light-emitting diode (OLED) display, comprising: a substrate; a first semiconductor layer formed over the substrate and including a first channel region, a first source region, a first drain region, and a lightly doped region formed between i) the first channel region and ii) the first source and drain regions; a second semiconductor layer formed over the substrate and including a second channel region, a second source region, and second drain region; a gate insulating layer formed over the first and second semiconductor layers and the substrate; a first gate electrode formed over the gate insulating layer wherein the first gate electrode is formed directly above at least a portion of the first semiconductor layer; a first interlayer insulating layer formed over the first gate electrode and the gate insulating layer; a second gate electrode formed over the first interlayer insulating layer wherein the second gate electrode is formed directly above at least a portion of the first gate electrode; and a third gate electrode formed directly above at least a portion of the second semiconductor layer, wherein the width of the second gate electrode is less than that of the first gate electrode, wherein at least a portion of the lightly doped region overlaps the first gate electrode, and wherein the lightly doped region does not overlap the second gate electrode.

In the above display, the first channel region overlaps i) at least a portion of the first gate electrode and ii) the second gate electrode and wherein the first source and drain regions overlap neither the first gate electrode nor the second gate electrode. The above display further comprises a blocking film formed between i) the substrate and ii) the first and second semiconductor layers. In the above display, the first semiconductor layer is doped with at least one of boron, gallium, phosphorus, or arsenic. In the above display, the lightly doped region comprises an offset region including fewer impurities than each of the first source and drain regions. In the above display, the second channel region is formed directly below the third gate electrode and wherein the second source and drain regions do not overlap the third gate electrode.

In the above display, the first gate electrode has a thickness of less than about 1000 Å. The above display further comprises: a second interlayer insulating layer formed over the second and third gate electrodes; a plurality of data conductors formed over the second interlayer insulating layer; a passivation layer formed over the data conductors; a plurality of pixel electrodes formed over the passivation layer; a pixel defining layer formed over the passivation layer and at least a portion of the pixel electrodes; an organic light-emitting layer formed over the pixel electrodes; and a common electrode formed over the organic light-emitting layer, wherein the second interlayer insulating layer and the gate insulating layer define a plurality of contact holes, wherein the passivation layer defines a plurality of contact holes, wherein the data conductors pass through the respective contact holes to be electrically connected to the first source and drain regions, the second source and drain regions, and the pixel electrodes. In the above display, the first semiconductor layer and the first and second gate electrodes form a switching thin film transistor electrically connected to the data conductors and wherein the second semiconductor layer and the third gate electrode form a driving thin film transistor electrically connected to the organic light-emitting layer.

Another aspect is a method of manufacturing an organic light-emitting diode (OLED) display, comprising: forming a first semiconductor layer and a second semiconductor layer over a substrate; forming a gate insulating layer over the first and second semiconductor layers and the substrate; forming a first gate electrode over the gate insulating layer such that the first gate electrode is formed directly above at least a portion the first semiconductor layer; forming a first interlayer insulating layer over the first gate electrode and the gate insulating layer; forming a second gate electrode over the first interlayer insulating layer such that the second gate electrode is formed directly above at least a portion of the first gate electrode; forming a third gate electrode over the first interlayer insulating layer such that the third gate electrode is formed directly above at least a portion of the second semiconductor layer; and doping the first and second semiconductor layers, wherein the width of the second gate electrode is less than that of the first gate electrode, wherein the first semiconductor layer includes a first channel region, a first source region, a first drain region, and a lightly doped region between i) the first channel region and ii) the first source and drain regions, wherein the lightly doped region overlaps the first gate electrode and does not overlap the second gate electrode.

In the above method, the first channel region overlaps i) at least a portion of the first gate electrode and ii) the second gate electrode and wherein the first source and drain regions overlaps neither the first gate electrode nor the second gate electrode. The above method further comprises forming a blocking film over the substrate before forming the first and second semiconductor layers. In the above method the doping comprises doping with at least one of boron, gallium, phosphorus, or arsenic. In the above method, the lightly doped region comprises an offset region including fewer impurities than each of the first source and drain regions. In the above method, the second channel region is formed substantially directly below the third gate electrode and wherein the second source and drain regions do not overlap the third gate electrode.

In the above method, the first gate electrode has a thickness of less than about 1000 Å. The above method further comprising: forming a second interlayer insulating layer over the second and third gate electrodes; forming a plurality of first contact holes in the second interlayer insulating layer and the gate insulating layer to expose the first source and drain regions and the second source and drain regions; forming a plurality of data conductors over the second interlayer insulating layer and in the first contact holes; forming a passivation layer over the data conductors; forming a plurality of second contact holes in the passivation layer to expose the data conductors; forming a plurality of pixel electrodes over the passivation layer and in the second contact holes; forming a pixel defining layer over the passivation layer and at least a portion of the pixel electrodes; forming an organic light-emitting layer over the pixel electrodes; and forming a common electrode over the organic light-emitting layer. In the above method, the first semiconductor layer and the first and second gate electrodes form a switching thin film transistor electrically connected to the data conductors and wherein the second semiconductor layer and the third gate electrode form a driving thin film transistor electrically connected to the organic light-emitting layer.

Another aspect is an organic light-emitting diode (OLED) display including a plurality of thin film transistors (TFTs), each TFT comprising: a substrate; a semiconductor layer formed over the substrate and including a first channel region, a source region, a drain region, and a lightly doped region formed between i) the first channel region and ii) the source and drain regions; a first gate electrode formed directly over at least a portion of the semiconductor layer; and a second gate electrode formed directly over at least a portion of the first gate electrode, wherein the width of the second gate electrode is less than that of the first gate electrode, wherein at least a portion of the lightly doped region overlaps the first gate electrode and does not overlap the second gate electrode.

In the above display, the semiconductor layer further comprises: a second channel region; and an intermediate region, wherein the lightly doped region is further located between i) the intermediate region and ii) the first and second channel regions, wherein the first gate electrode comprises a pair of first gate electrodes respectively formed directly above the first and second channel regions, and wherein the second gate electrode comprises a pair of second gate electrodes respectively formed directly above the pair of first gate electrodes.

According to at least one embodiment, the extrinsic region and the lightly doped region of the semiconductor layer of the OLED display may be easily formed and may achieve favorable characteristics in both on and off states, thereby improving the quality of the OLED display.

DETAILED DESCRIPTION OF CERTAIN INVENTIVE EMBODIMENTS

High mobility can be achieved in a thin film transistor by using a semiconductor layer having a crystalline structure as the active layer of the TFT (a crystalline thin film transistor). Functional circuits are commonly integrated on the same substrate in order to display high quality images.

To form an active matrix OLED display, one to two million crystalline thin film transistors are generally required in the display panel. A number of additional thin film transistors are required to form a functional circuit attached to the display. The stability of the OLED display depends on the uniformity and reliability of each crystalline thin film transistor.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

In the drawings, the thicknesses of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An organic light-emitting diode (OLED) display according to an exemplary embodiment will now be described in detail with reference to accompanying drawings.

Figure 1:
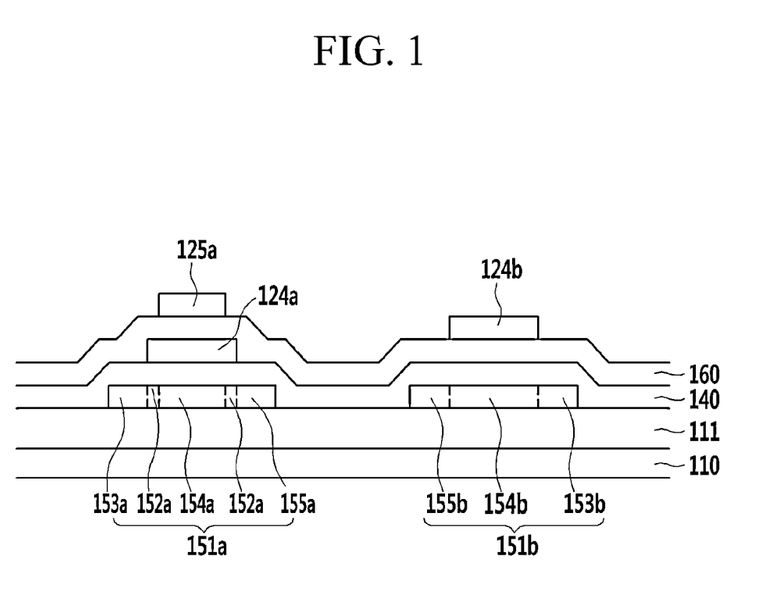
FIG. 1 is a cross-sectional view of the structure of a semiconductor layer of an OLED display according to an exemplary embodiment.

FIG. 1 is a cross-sectional view of the structure of a semiconductor layer of an OLED display according to an exemplary embodiment.

Referring to FIG. 1, the OLED display includes a blocking film 111 formed of a silicon nitride (SiNx) or a silicon oxide (SiOx). The blocking film 111 is formed on an insulation substrate 110 formed of transparent glass or plastic. The blocking film 111 may have a dual-layered structure.

According to some embodiments, a plurality of pairs of first and second semiconductor islands or semiconductor layers 151a and 151b that are formed of polysilicon are formed on the blocking film 111. The semiconductor islands 151a and 151b respectively include a plurality of extrinsic regions including conductive impurities of an n-type or a p-type and at least one intrinsic region that does not include conductive impurities.

According to some embodiments, in the first semiconductor island 151a, the extrinsic region includes first source and drain regions 153a and 155a that are doped with an n-type impurity and separated from each other. The intrinsic region includes a channel region 154a positioned between the extrinsic regions 153a and 155a.

The extrinsic region further includes a lightly doped region 152a positioned between the first channel region 154a and the first source and drain regions 153a and 155a. The lightly doped region may be replaced with an offset region including a relatively low amount of impurities, i.e. the offset region may include fewer impurities than each of the first source and drain regions 153a and 155a.

The first source and drain regions 153a and 155a may be formed at a region outside the width of a first gate electrode 124a, the lightly doped region 152a is formed at a position corresponding to the difference in width between the first gate electrode 124a and a second gate electrode 125a, and the first channel region 154a is formed at a position corresponding to the width of the second gate electrode 125a.

The lightly doped drain (LDD) structure smoothes a high electric field near the drain to decrease the off current in the thin film transistor. The lightly doped extrinsic region formed outside of the channel region and is referred to as an LDD region.

According to some embodiments, in the second semiconductor island 151b, the extrinsic region includes second source and drain regions 153b and 155b that are doped with a p-type impurity and are separated from each other. The intrinsic region includes a second channel region 154b formed between the second source and drain regions 153b and 155b.

Alternatively, the extrinsic regions 153a and 155a of the first semiconductor island 151a may be doped with p-type impurities and the extrinsic regions 153b and 155b of the second semiconductor island 151b may be doped with n-type impurities. The conductive p-type impurity may be boron (B) or gallium (Ga) and the conductive n-type impurity may be phosphorus (P) or arsenic (As).

According to some embodiments, a gate insulating layer 140 formed of a silicon nitride or a silicon oxide is formed on the semiconductor islands 151a and 151b and the blocking film 111.

A plurality of gate lines are formed on the gate insulating layer 140. The gate lines include the first gate electrode 124a positioned corresponding to the channel region 154a and the lightly doped region 152a of the first semiconductor 151a.

The gate lines transmit gate signals and are substantially extended in the transverse direction. The first gate electrode 124a extends upward from the gate line, thereby intersecting the first semiconductor 151a and overlapping the first channel region 154a. Each gate line may include an end portion having a large area for contact with another layer or an external driving circuit. When a gate driving circuit or gate driver (not shown) for generating gate signals is formed directly on the substrate 110, the gate lines may extend and be directly connected to the gate driving circuit.

A gate conductor including the first gate electrode 124a may be formed of an aluminum-based metal including aluminum (Al) or aluminum alloys, a silver-based metal including silver (Ag) or silver alloys, a copper-based metal including copper (Cu) or copper alloys, a molybdenum-based metal including molybdenum (Mo) or molybdenum alloys, chromium (Cr), tantalum (Ta), titanium (Ti), etc. However, they may have a multi-layer structure including two conductive layers (not shown) that have different physical properties from each other. One of the conductive layers may be formed using a metal having low resistivity, such as an aluminum-based metal, a silver-based metal, or a copper-based metal, in order to reduce signal delay or voltage drop. Other conductive layers may be formed using a material having good physical, chemical, and electrical contact characteristics particularly with indium tin oxide (ITO) and indium zinc oxide (IZO), such as a molybdenum-based metal, chromium, tantalum, titanium, or the like. Examples of the combination may include a lower chromium film and an upper aluminum (alloy) film, and a lower aluminum (alloy) film and an upper molybdenum (alloy) film. However, the gate conductors may be made of various metals or conductors.

The thickness of the first gate electrode may be less than about 1000 Å. Such a thickness assists in the formation of the lightly doped region 152a by partially transmitting the impurity through the first gate electrode 124a when doping the impurity to the first semiconductor 151a; however, the impurity is not transmitted through the second gate electrode 125a.

A first interlayer insulating layer 160 is formed on the gate conductor including the first gate electrode 124a. The first interlayer insulating layer 160 is made of an inorganic insulator such as a silicon nitride, a silicon oxide, etc., an organic insulator, or an insulator having a low dielectric constant. In some embodiments, the dielectric constant of the organic insulator and the low dielectric insulator is less than about 4.0, for example a-Si:C:O or a-Si:O:F, which is formed through plasma enhanced chemical vapor deposition (PECVD). The first interlayer insulating layer 160 may be made of an organic insulator having photosensitivity and may provide a flat surface.

The second gate electrode 125a is formed on the first interlayer insulating layer 160 to overlap the first gate electrode 124a and the first channel region 154a. A third gate electrode 124b is also formed on the first interlayer insulating layer 160 to overlap the channel region 154b of the second semiconductor 151b.

The second gate electrode 125a is formed to assist in the formation the lightly doped region 152a in the first channel region 154a of the first semiconductor 151a.

The second gate electrode 125a has a narrower width than that of the first gate electrode 124a. The width of the lightly doped region 152a corresponds to the difference in width between the first gate electrode 124a and the second gate electrode 125a. Accordingly, by controlling the size of a mask of the second gate electrode 125a, the size of the lightly doped region 152a may be easily predetermined.

The third gate electrode 124b is separated from the gate line and overlaps the second channel region 154b of the second semiconductor 151b.

The second and third gate electrodes 125a and 124b may be formed of an aluminum-based metal including aluminum (Al) or aluminum alloys, a silver-based metal including silver (Ag) or silver alloys, a copper-based metal including copper (Cu) or copper alloys, a molybdenum-based metal including molybdenum (Mo) or molybdenum alloys, chromium (Cr), tantalum (Ta), titanium (Ti), etc. However, they may have a multi-layer structure including two conductive layers (not shown) that have different physical properties from each other. One of the conductive layers may be formed using a metal having low resistivity, such as an aluminum-based metal, a silver-based metal, or a copper-based metal, in order to reduce signal delay or voltage drop. Other conductive layers may be formed using a material having good physical, chemical, and electrical contact characteristics particularly with indium tin oxide (ITO) and indium zinc oxide (IZO), such as a molybdenum-based metal, chromium, tantalum, titanium, or the like. Examples of the combination may include a lower chromium film and an upper aluminum (alloy) film, and a lower aluminum (alloy) film and an upper molybdenum (alloy) film. However, they may be made of various metals or conductors.

A second interlayer insulating layer 161 is formed on the gate conductor including the second gate electrode 125a and the third gate electrode 124b. The second interlayer insulating layer 161 is made of an inorganic insulator such as a silicon nitride, a silicon oxide, etc., an organic insulator, or an insulator having a low dielectric constant. In some embodiments, the dielectric constant of the organic insulator and the low dielectric insulator is less than about 4.0, for example a-Si:C:O or a-Si:O:F, which is formed through plasma enhanced chemical vapor deposition (PECVD). The second interlayer insulating layer 161 may be made of an organic insulator having photosensitivity and may provide a flat surface.

In the OLED display shown in FIG. 1, the first semiconductor 151a, the first gate electrode 124a, and the second gate electrode 125a formed on the first gate electrode 124a form a switching thin film transistor (TFT) Qs and are connected to a data conductor and the second semiconductor 151b and the third gate electrode 124b form a driving thin film transistor (TFT) Qd and are connected to an OLED.

Next, an OLED display according to an exemplary embodiment will be described with reference to FIG. 2.

Figure 2:
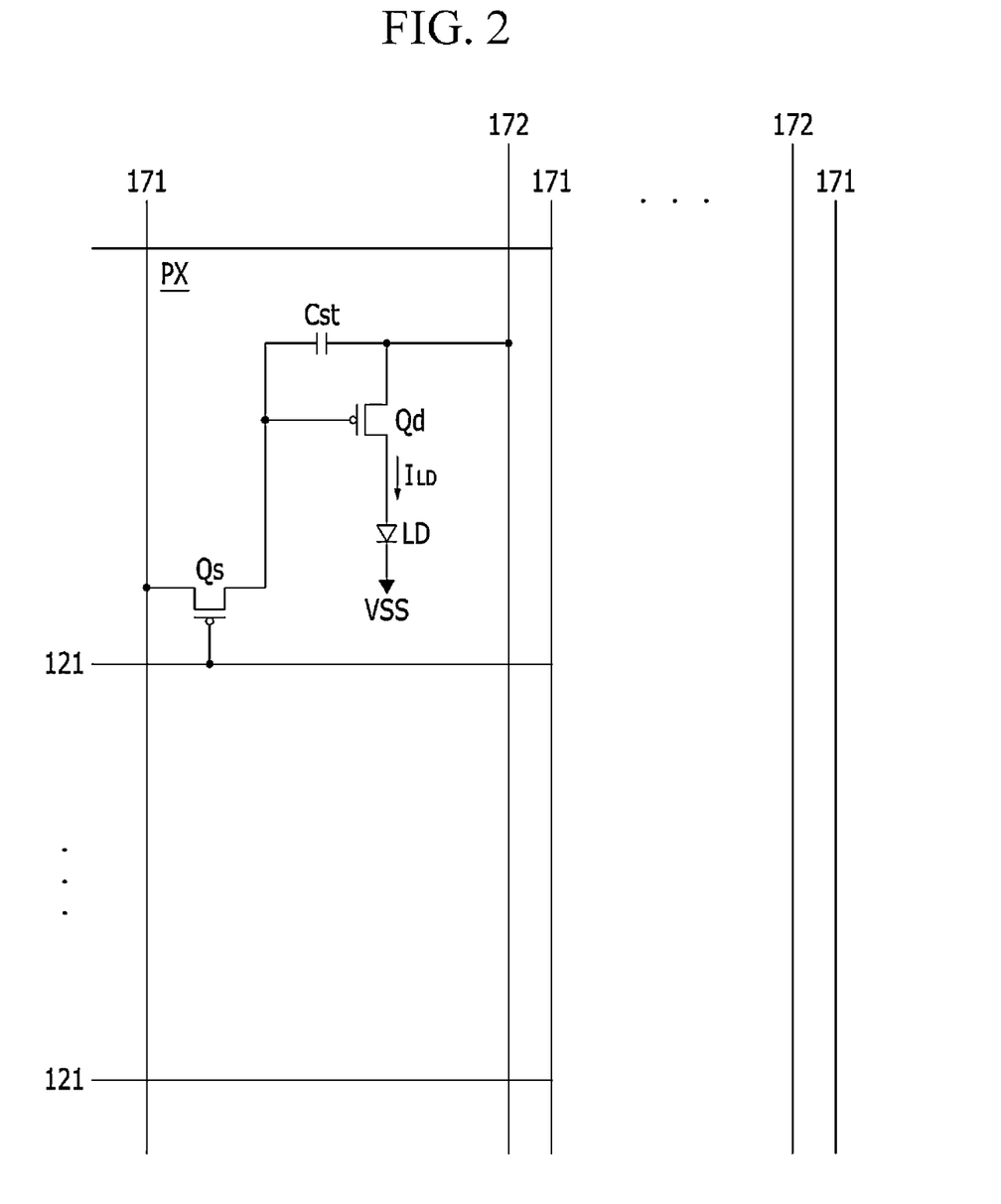
FIG. 2 is an equivalent circuit diagram of an OLED display according to an exemplary embodiment.

FIG. 2 is an equivalent circuit diagram of an OLED display according to an exemplary embodiment.

Referring to FIG. 2, the OLED display includes a plurality of signal lines 121, 171, and 172 and a plurality of pixels PX that are connected to the signal lines 121, 171, and 172 and arranged in a matrix.

The signal lines includes a plurality of gate lines 121 for transferring gate signals or scanning signals, a plurality of data lines 171 for transferring data signals, and a plurality of driving voltage lines 172 for transferring driving voltages. The gate lines 121 extend in a row direction substantially parallel to each other, while the data lines 171 and the driving voltage lines 172 extend in a column direction substantially parallel to each other.

Each of the pixels PX includes a switching transistor Qs, a driving transistor Qd, a storage capacitor Cst, and an OLED LD.

The switching transistor Qs includes a control terminal, an input terminal, and an output terminal. The control terminal is connected to the gate line 121, the input terminal is connected to the data line 171, and the output terminal is connected to the driving transistor Qd. The switching transistor Qs transfers a data signal supplied to the data line 171 to the driving transistor Qd in response to a scanning signal supplied to the gate line 121.

The driving transistor Qd also includes a control terminal, an input terminal, and an output terminal. The control terminal is connected to the switching transistor Qs, the input terminal is connected to the driving voltage line 172, and the output terminal is connected to the OLED LD. The driving transistor Qd outputs an output current ILD having a magnitude that varies depending on the voltage between the control terminal and the output terminal.

The capacitor Cst is connected between the control terminal and the input terminal of the driving transistor Qd. The capacitor Cst stores a data signal supplied to the control terminal of the driving transistor Qd and maintains the charged data signal even after the switching transistor Qs is turned off.

The OLED LD includes an anode connected to the output terminal of the driving transistor Qd and a cathode connected to a common voltage Vss. The OLED LD emits lights with an intensity dependent on the output current ILD of the driving transistor Qd so as to display images.

According to some embodiments, the switching transistor Qs is an n-channel electric field effect transistor (FET) and the driving transistor Qd is a p-channel electric field effect transistor. However, the channel types of the switching transistor Qs and the driving transistor Qd may be exchanged and the two transistors Qs and Qd may respectively be n-channel and the p-channel electric field effect transistors. Also, the connection relationship of the transistors Qs and Qd, the capacitor Cst, and the OLED LD may be changed.

Next, the OLED display according to an exemplary embodiment will be described with reference to FIG. 3 to FIG. 5.

Figure 3:
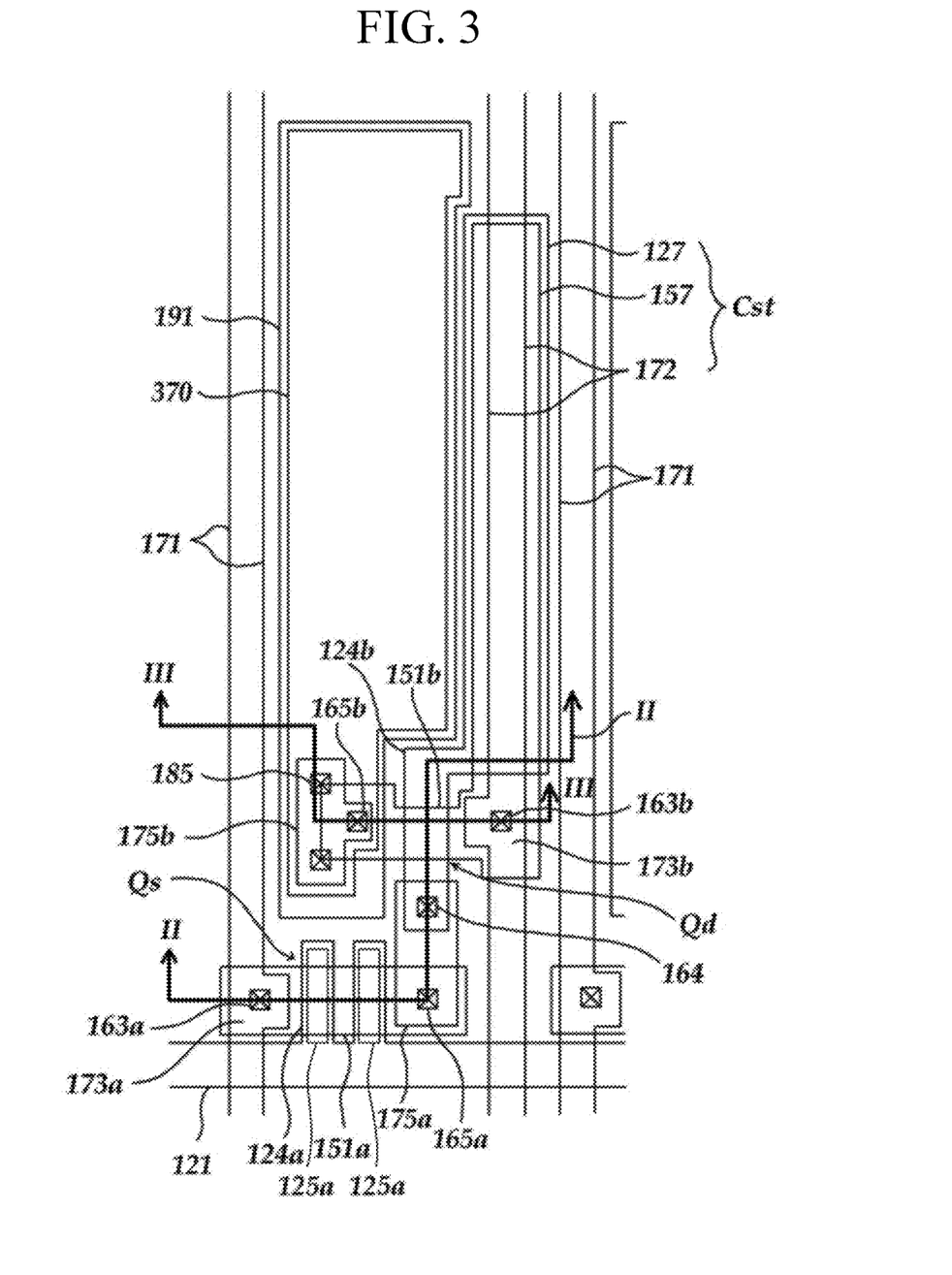
FIG. 3 is a layout view of an OLED display according to an exemplary embodiment.
Figure 4:
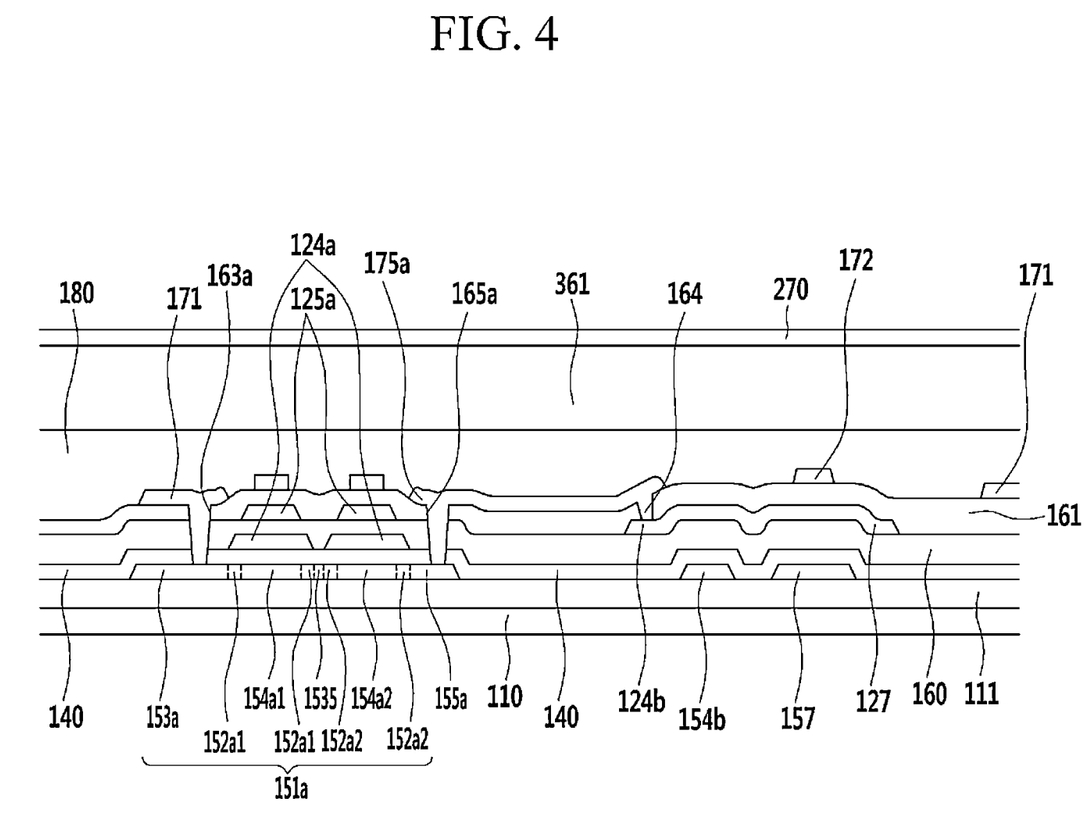
FIG. 4 is a cross-sectional view of the OLED display of FIG. 3 taken along line II-II.
Figure 5:
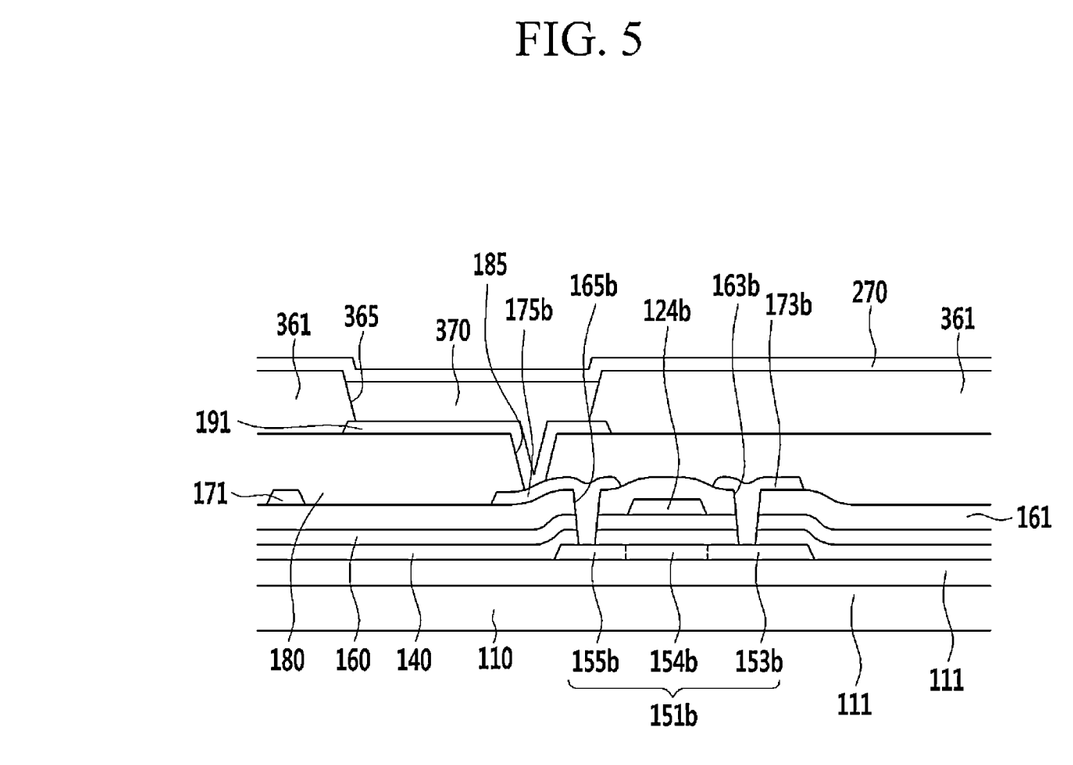
FIG. 5 is a cross-sectional view of the OLED display of FIG. 3 taken along line III-III.

FIG. 3 is a layout view of an OLED display according to an exemplary embodiment, FIG. 4 is a cross-sectional view of the OLED display of FIG. 3 taken along line II-II, and FIG. 5 is a cross-sectional view of the OLED display of FIG. 3 taken along line III-III.

The OLED display according to an exemplary embodiment includes the blocking film 111 formed of a silicon nitride (SiNx) or a silicon oxide (SiOx). The blocking film 111 is formed on the insulation substrate 110 formed of transparent glass or plastic. The blocking film 111 may have a dual-layered structure.

According to some embodiments, a plurality of pairs of first and second semiconductor islands 151a and 151b that are formed of polysilicon are formed on the blocking film 111. The semiconductor islands 151a and 151b respectively include a plurality of extrinsic regions including n-type or p-type conductive impurities and at least one intrinsic region that does not include conductive impurities.

According to some embodiments, in the first semiconductor island 151a, the extrinsic region includes the first source and drain regions 153a and 155a and an intermediate region 1535 that are doped with an n-type impurity and separated from each other. The intrinsic region includes a pair of first channel regions 154a1 and 154a2 positioned between the extrinsic regions 153a, 1535, and 155a.

In the first semiconductor 151a, the extrinsic region further includes lightly doped regions 152a1 and 152a2 positioned between the first channel regions 154a1 and 154a2 and the first source and drain regions 153a and 155a. The lightly doped region may be replaced with an offset region which includes including a relatively low amount of impurities.

The lightly doped drain (LDD) structure smoothes a high electric field near the drain to decrease the off current in the thin film transistor and the lightly doped extrinsic region is formed outside of the channel region and is referred to as an LDD region.

According to some embodiments, the second semiconductor island 151b, the extrinsic region includes the second source and drain regions 153b and 155b that are doped with a p-type impurity and are separated from each other. The intrinsic region includes the second channel region 154b disposed between the second source and drain regions 153b and 155b and a storage region 157 extending from the second source and drain regions 153b and 155b.

Alternatively, the extrinsic regions 153a and 155a of the first semiconductor island 151a may be doped with p-type impurities and the extrinsic regions 153b and 155b of the second semiconductor island 151b may be doped with n-type impurities. The conductive p-type impurity may be boron (B) or gallium (Ga) and the conductive impurity of the n-type may be phosphorus (P) or arsenic (As).

According to some embodiments, the gate insulating layer 140 is formed of a silicon nitride or a silicon oxide and is formed on the semiconductor islands 151a and 151b and the blocking film 111.

The gate lines 121 including the first gate electrodes 124a are formed on the gate insulating layer 140.

The gate lines 121 transmit gate signals and are substantially extended in the transverse direction. The first gate electrode 124a is extended upward from the gate line, thereby intersecting the first semiconductor 151a and overlapping the first channel regions 154a1 and 154a2. Each gate line 121 may include an end portion having a large area for contact with another layer or an external driving circuit. When a gate driving circuit (not shown) for generating gate signals is formed directly on the substrate 110, the gate lines 121 may extend and be directly connected to the gate driving circuit.

A gate conductor including the first gate electrode 124a may be made of an aluminum-based metal including aluminum (Al) or aluminum alloys, a silver-based metal including silver (Ag) or silver alloys, a copper-based metal including copper (Cu) or copper alloys, a molybdenum-based metal including molybdenum (Mo) or molybdenum alloys, chromium (Cr), tantalum (Ta), titanium (Ti), etc. However, they may have a multi-layer structure including two conductive layers (not shown) that have different physical properties from each other. One of the conductive layers may be formed using a metal having low resistivity, such as an aluminum-based metal, a silver-based metal, or a copper-based metal, in order to reduce signal delay or voltage drop. Other conductive layers may be formed using a material having good physical, chemical, and electrical contact characteristics particularly with indium tin oxide (ITO) and indium zinc oxide (IZO), such as a molybdenum-based metal, chromium, tantalum, titanium, or the like. Examples of the combination may include a lower chromium film and an upper aluminum (alloy) film, and a lower aluminum (alloy) film and an upper molybdenum (alloy) film. However, the gate conductors may be made of various metals or conductors.

The first interlayer insulating layer 160 is formed on the gate conductor including the first gate electrode 124a. The first interlayer insulating layer 160 is made of an inorganic insulator such as a silicon nitride, a silicon oxide, etc., an organic insulator, or an insulator having a low dielectric constant. In some embodiments, the dielectric constant of the organic insulator and the low dielectric insulator is less than about 4.0, for example a-Si:C:O or a-Si:O:F, which is formed through plasma enhanced chemical vapor deposition (PECVD). The first interlayer insulating layer 160 may be formed of an organic insulator having photosensitivity and may provide a flat surface.

The second gate electrode 125a is formed on the first interlayer insulating layer 160 to overlap the first gate electrode 124a and the first channel region 154a. The third gate electrode 124b is also formed on the first interlayer insulating layer 160 to overlap the channel region 154b of the second semiconductor 151b.

The second gate electrode 125a assists in forming the lightly doped region 152a in the first channel region 154a of the first semiconductor 151a.

The second gate electrode 125a has a narrower width than that of the first gate electrode 124a. The width of the lightly doped region 152a corresponds to the difference in width between the first and second gate electrodes 124a and 135a. Accordingly, by controlling the size of the mask of the second gate electrode 125a, the size of the lightly doped region 152a may be easily predetermined.

The third gate electrode 124b is separated from the gate line and overlaps the second channel region 154b of the second semiconductor 151b. The third gate electrode 124b is extended forming a storage electrode 127 and the storage electrode 127 overlaps the storage region 157 of the second semiconductor 151b.

The second and third gate electrodes 125a and 124b may be formed of an aluminum-based metal including aluminum (Al) or aluminum alloys, a silver-based metal including silver (Ag) or silver alloys, a copper-based metal including copper (Cu) or copper alloys, a molybdenum-based metal including molybdenum (Mo) or molybdenum alloys, chromium (Cr), tantalum (Ta), titanium (Ti), etc. However, they may have a multi-layer structure including two conductive layers (not shown) that have different physical properties from each other. One of the conductive layers may be formed using a metal having low resistivity, such as an aluminum-based metal, a silver-based metal, or a copper-based metal, in order to reduce signal delay or voltage drop. Other conductive layers may be formed using a material having good physical, chemical, and electrical contact characteristics particularly with indium tin oxide (ITO) and indium zinc oxide (IZO), such as a molybdenum-based metal, chromium, tantalum, titanium, or the like. Examples of the combination may include a lower chromium film and an upper aluminum (alloy) film, and a lower aluminum (alloy) film and an upper molybdenum (alloy) film. However, they may be made of various metals or conductors.

The second interlayer insulating layer 161 is formed on the gate conductor including the second and third gate electrodes 125a and 124b. The second interlayer insulating layer 161 is made of an inorganic insulator such as a silicon nitride, a silicon oxide, etc., an organic insulator, or an insulator having a low dielectric ratio. In some embodiments, the dielectric constant of the organic insulator and the low dielectric insulator is less than about 4.0, for example a-Si:C:O or a-Si:O:F, which is formed through plasma enhanced chemical vapor deposition (PECVD). The second interlayer insulating layer 161 may be made of an organic insulator having photosensitivity and may provide a flat surface.

The second interlayer insulating layer 161 has a plurality of contact holes 164 exposing the third gate electrode 124b. Also, the first and second interlayer insulating layers 160 and 161 and the gate insulating layer 140 have a plurality of contact holes 163a, 163b, 165a, and 165b exposing the source and drain regions 153a, 153b, 155a, and 155b.

A plurality of data conductors including a plurality of data lines 171, a plurality of driving voltage lines 172, and a plurality of first and second output electrodes 175a and 175b are formed on the second interlayer insulating layer 161.

The data lines 171 transmit a data signal and extend in the longitudinal direction thereby intersecting the gate lines 121. Each data line 171 includes a first input electrode 173a connected to the first source region 153a through the contact hole 163a and may include an end portion having a large area for contact with another layer or an external driving circuit. When a data driving circuit or data driver (not shown) for generating data signals is formed directly on the substrate 110, the data line 171 may extend and be directly connected to the data driving circuit.

The driving voltage lines 172 transmit a driving voltage and extend in a longitudinal direction, thereby intersecting the gate lines 121. Each driving voltage line 172 includes a plurality of second input electrodes 173b connected to the second source region 153b through the contact hole 163b. The driving voltage line 172 overlaps the storage electrode 127 and they may be connected to each other.

The first output electrode 175a is separated from the data line 171 and the driving voltage line 172. The first output electrode 175a is connected to the first drain region 155a through the contact hole 165a and to the third gate electrode 124b through the contact hole 164.

The second output electrode 175b is separated from the data line 171, the driving voltage line 172, and the first output electrode 175a, and is connected to the second drain region 155b through the contact hole 165b.

The data conductors 171, 172, 175a, and 175b may be made of a refractory metal such as molybdenum, chromium, tantalum, or titanium, or alloys thereof, and have a multi-layered structure including a refractory metal layer (not shown) and a low resistance conductive layer (not shown). The multi-layered structure includes, for example, a dual layer of a chromium or molybdenum (alloy) lower layer and an aluminum (alloy) upper layer, and a triple-layer of a molybdenum (alloy) lower layer, an aluminum (alloy) middle layer, and a molybdenum (alloy) upper layer. However, the data conductors 171, 172, 175a, and 175b may be made of various other metals or conductors.

A passivation layer 180 is formed on the data conductors 171, 172, 175a, and 175b. The passivation layer 180 is made of an inorganic material, an organic material, or a low dielectric constant insulating material.

The passivation layer 180 has a plurality of contact holes 185 exposing the second output electrode 175b. The passivation layer 180 may also have a plurality of contact holes (not shown) exposing the end of the data line 171 and the passivation layer 180 and the second interlayer insulating layer 161 may have a plurality of contact holes (not shown) exposing the end of the gate line 121.

A plurality of pixel electrodes 191 are formed on the passivation layer 180. The pixel electrodes 191 are physically and electrically connected to the second output electrodes 175b through the contact holes 185 and may be formed of a transparent conductive material such as ITO or IZO, or a reflective conductor such as silver, aluminum, or alloys thereof.

A plurality of contact assistants (not shown) or connecting members (not shown) may be formed on the passivation layer 180 and may be connected to the exposed ends of the gate lines 121 and the data lines 171.

Partitions or a pixel defining layer 361 are formed on the passivation layer 180. The partitions 361 define a plurality of openings enclosing edges of the pixel electrodes 191 like a bank and are made of an organic insulator or an inorganic insulator. The partitions 361 may be made of a photoresist including black pigments and the partitions 361 function as a light blocking member in this case thereby simplifying the manufacturing process.

An organic light-emitting member or organic light-emitting layer 370 is formed in openings 365 defined by the partitions 361 on the pixel electrode 191. According to some embodiments, the organic light-emitting member 370 functions as an emission layer and is formed of an organic material uniquely emitting light of one primary color such as one of three primary colors of red, green, and blue. The OLED display may also display desired images by a spatial combination of the colored light of the primary colors emitted by the organic light-emitting members 370.

The organic light-emitting member 370 may have a multi-layered structure including auxiliary layers (not illustrated) for improving light emission efficiency of an emitting layer in addition to the emitting layer (not illustrated) emitting light. In the auxiliary layers, an electron transport layer (not illustrated), a hole transport layer (not illustrated) for adjusting the balance of electrons and holes, an electron injecting layer (not illustrated), and a hole injecting layer (not illustrated) for reinforcing injection of the electrons and the holes, are included.

A common electrode 270 is formed on the organic light-emitting member 370. The common electrode 270 receives a common voltage Vss and may be formed of reflective metal including calcium (Ca), barium (Ba), magnesium (Mg), aluminum, silver, or the like, or a transparent conductive material such as ITO or IZO.

In the OLED display, the first semiconductor 151a, the first gate electrode 124a connected to the gate line 121, the second gate electrode 125a formed on the first gate electrode 124a, the first input electrode 173a connected to the data line 171, and the first output electrode 175a together form the switching thin film transistor (TFT) Qs. The channel of the switching thin film transistor Qs is formed in the first channel regions 154a1 and 154a2 of the first semiconductor 151a. The second semiconductor 151b, the third gate electrode 124b connected to the first output electrode 175a, the second input electrode 173b connected to the driving voltage line 172, and the second output electrode 175b connected to the pixel electrode 191 together form the driving thin film transistor (TFT) Qd connected to the organic light-emitting member. The channel of the driving thin film transistor Qd is formed in the channel region 154b of the second semiconductor 151b. The pixel electrode 191, the organic light-emitting member 370, and the common electrode 270 form the OLED. The pixel electrode 191 is an anode and the common electrode 270 is a cathode, or alternatively, the pixel electrode 191 is a cathode and the common electrode 270 is an anode. The storage electrode 127, the driving voltage line 172, and the storage region 157, which overlap each other, may form a storage capacitor Cst.

Such an OLED display emits light upward or downward from the substrate 110 to display an image. An opaque pixel electrode 191 and a transparent common electrode 270 are applied to a top emission OLED display which displays an image in an upper direction of the substrate 110. A transparent pixel electrode 191 and an opaque common electrode 270 are applied to a bottom emission OLED display which displays an image in a lower direction of the substrate 110.

Next, a manufacturing method of a thin film transistor in the OLED display according to an exemplary embodiment will be described with reference to FIG. 6 to FIG. 8.

Figure 6:
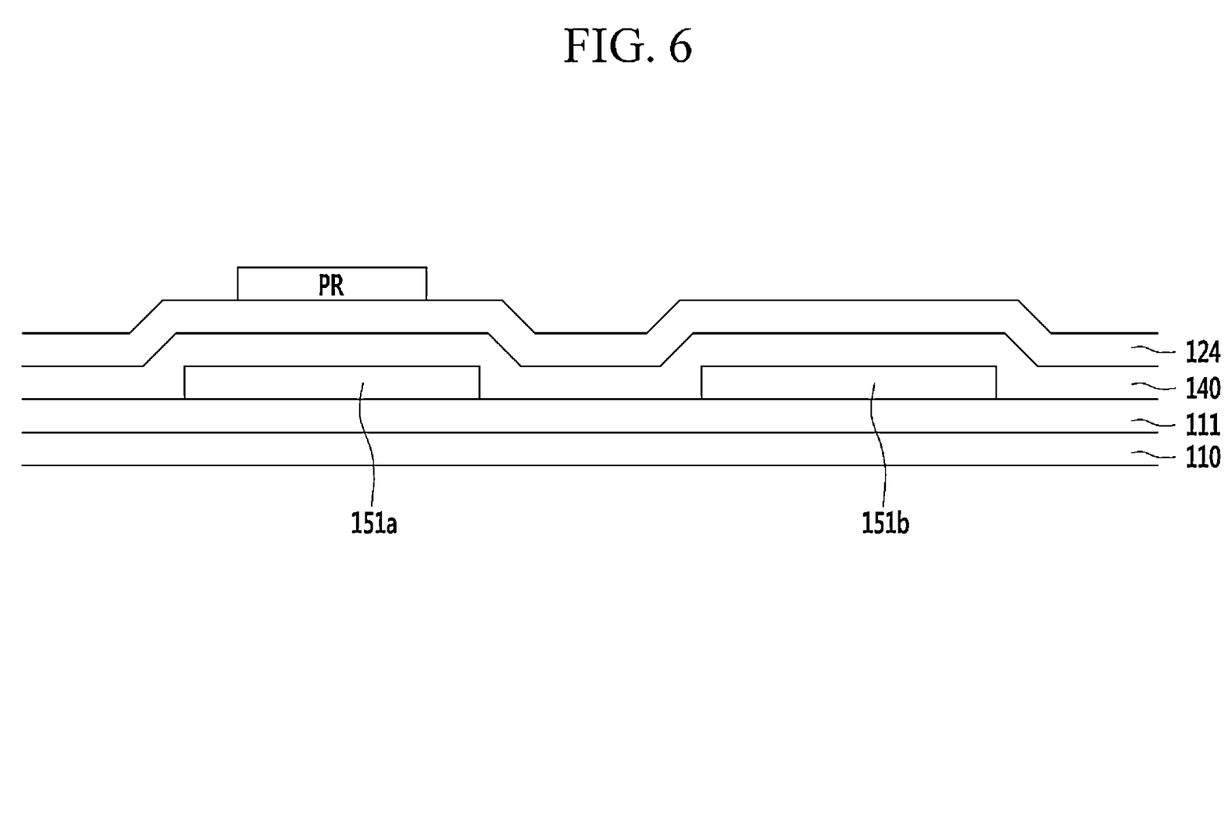
FIG. 6 to FIG. 8 are views showing a method of manufacturing an OLED display according to an exemplary embodiment.
Figure 7:
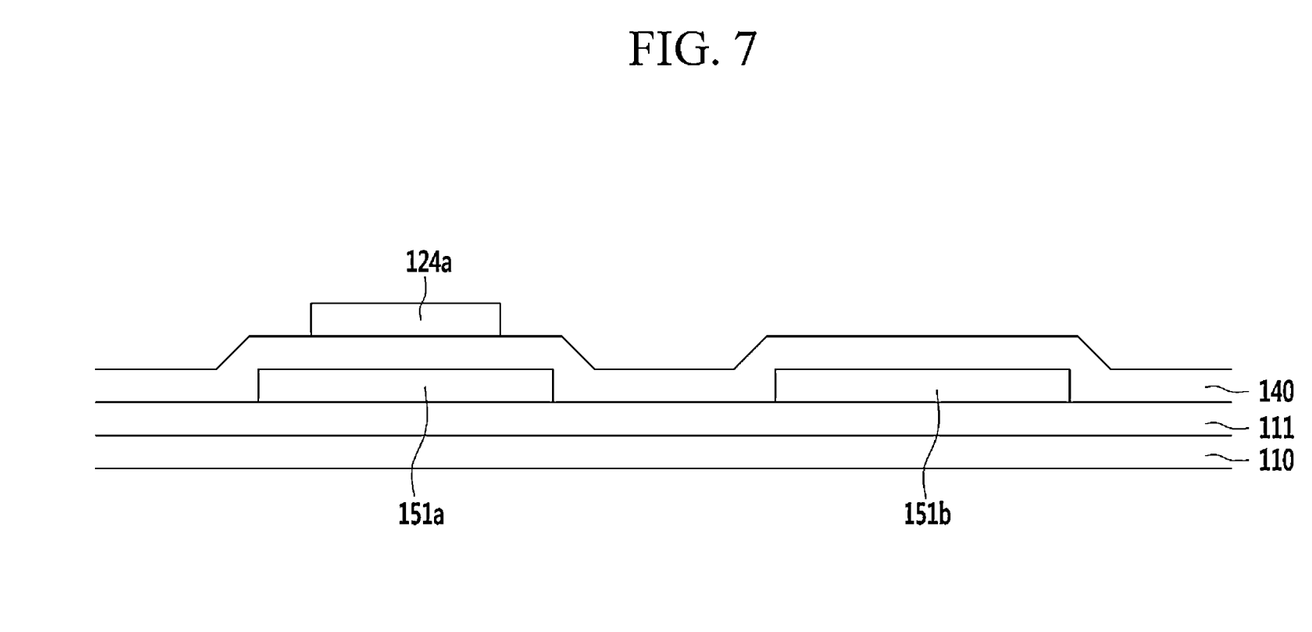
Figure 8:
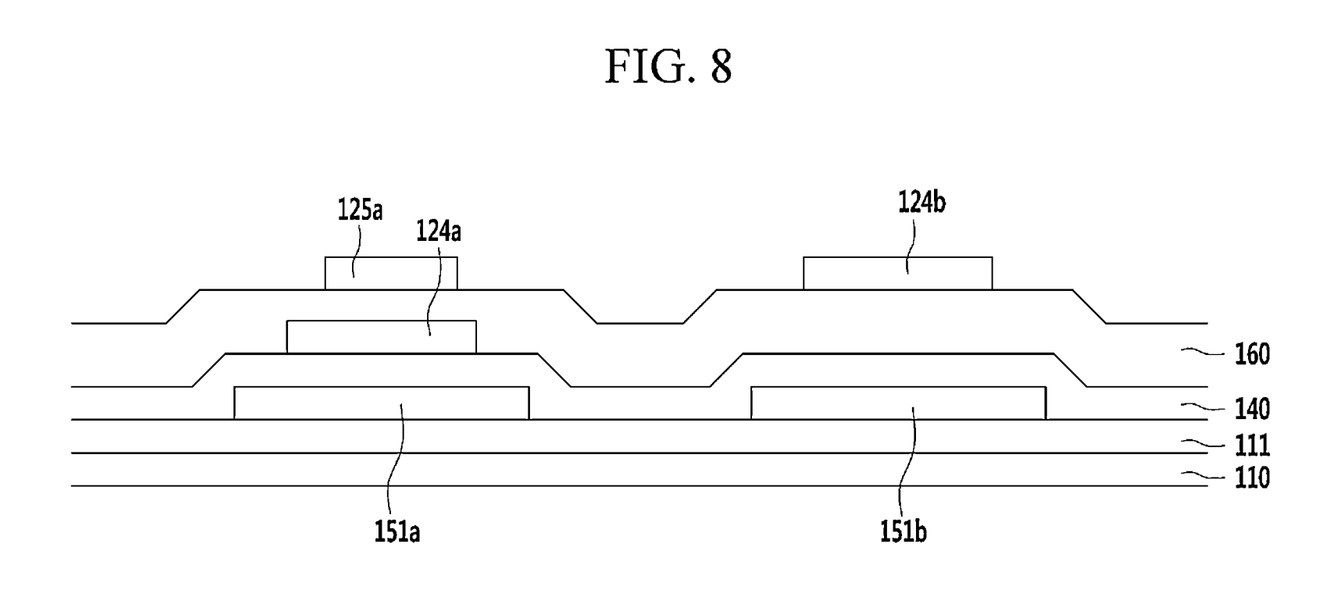

FIG. 6 to FIG. 8 are views showing a method of manufacturing an OLED display according to an exemplary embodiment.

Referring to FIG. 6 and FIG. 7, a blocking film 111 formed of a silicon nitride (SiNx) or a silicon oxide (SiOx) is formed on an insulation substrate 110 formed of transparent glass or plastic. The blocking film 111 may be formed to have a dual-layer structure.

A plurality of pairs of the first and second semiconductor islands 151a and 151b formed of polysilicon are formed on the blocking film 111 and a gate insulating layer 140 formed of a silicon nitride or a silicon oxide is formed covering the first and second semiconductors 151a and 151b and the blocking film 111.

Next, a conductive layer 124 is formed to form the first gate electrode 124a and a photoresist mask PR is formed on the first semiconductor layer 151a at a position to form the first gate electrode 124a on the conductive layer 124.

The conductive layer 124 is etched by using the photoresist mask PR to form the first gate electrode 124a.

The thickness of the first gate electrode 124a is formed to be less than about 1000 Å in order to facilitate the formation of the lightly doped region 152a by partially transmitting the impurity through the first gate electrode 124a when doping the impurity to the first semiconductor 151a. The impurity is not transmitted through the second gate electrode 125a.

Next, referring to FIG. 8, the first interlayer insulating layer 160 formed of an inorganic insulator such as a silicon nitride or a silicon oxide, an organic insulator, or a low dialectic insulator is formed on the first gate electrode 124a.

The second gate electrode 125a is formed on the first interlayer insulating layer 160 and positioned over each of the first semiconductor 151a and the first gate electrode 124a. A third gate electrode 124b is formed on the first interlayer insulating layer and positioned over the second semiconductor 151b.

At this time, the second gate electrode 125a is formed to have a narrower width than that of the first gate electrode 124a so as to be appropriate for forming the lightly doped region 152a of the first semiconductor 151a with the desired width. The third gate electrode 124b is formed with a width corresponding to the width of the channel region of the second semiconductor 151b.

According to some embodiments, first doping is then performed on the first semiconductor layer 151a to add the impurity element providing the n-type conductivity. The doping is performed by using the first gate electrode 124a and the second gate electrode 125a as a mask for the impurity element and is performed to add the impurity element to the region under the first gate electrode 124a.

Accordingly, the lightly doped region (LDD region) 152a overlapping the first gate electrode 124a and the source and drain regions 153a and 155a having a higher impurity concentration than the lightly doped region 152a may be formed.

Through the process, the first source and drain regions 153a and 155a may be formed outside the width of the first gate electrode 124a, the lightly doped region 152a may be formed at the position corresponding to the difference in width between the first and second gate electrodes 124a and 125a, and the channel region 154a may be positioned at the position corresponding to the width of the second gate electrode 125a.

Accordingly, control of the width of the lightly doped region 152a is possible by controlling the width of the second gate electrode 125a.

In the OLED display according to the exemplary embodiment shown in FIG. 6 to FIG. 8, the first semiconductor 151a, the first gate electrode 124a, and the second gate electrode 125a formed on the first gate electrode 124a together form the switching thin film transistor (TFT) Qs. The switching TFT Qs is connected to the data conductor. The second semiconductor 151b and the third gate electrode 124b form the driving thin film transistor (TFT) Qd and is connected to the organic light-emitting member.

As described above, according to an exemplary embodiment, the extrinsic region and the lightly doped region of the semiconductor layer of the OLED display may be easily formed and high quality characteristics may be obtained in the on and off states.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a first semiconductor layer formed over the substrate and including a first channel region, a first source region, a first drain region, and a lightly doped region formed between i) the first channel region and ii) the first source and drain regions;

a second semiconductor layer formed over the substrate and including a second channel region, a second source region, and second drain region;

a gate insulating layer formed over the first and second semiconductor layers and the substrate;

a first gate electrode formed over the gate insulating layer wherein the first gate electrode is formed directly above at least a portion of the first semiconductor layer;

a first interlayer insulating layer formed over the first gate electrode and the gate insulating layer;

a second gate electrode formed over the first interlayer insulating layer wherein the second gate electrode is formed directly above at least a portion of the first gate electrode; and a third gate electrode formed directly above at least a portion of the second semiconductor layer, wherein the width of the second gate electrode is less than that of the first gate electrode, wherein at least a portion of the lightly doped region overlaps the first gate electrode, and wherein the lightly doped region does not overlap the second gate electrode.

2. The OLED display of claim 1, wherein the first channel region overlaps i) at least a portion of the first gate electrode and ii) the second gate electrode and wherein the first source and drain regions overlap neither the first gate electrode nor the second gate electrode.

3. The OLED display of claim 2, further comprising a blocking film formed between i) the substrate and ii) the first and second semiconductor layers.

4. The OLED display of claim 3, wherein the first semiconductor layer is doped with at least one of boron, gallium, phosphorus, or arsenic.

5. The OLED display of claim 2, wherein the lightly doped region comprises an offset region including fewer impurities than each of the first source and drain regions.

6. The OLED display of claim 1, wherein the second channel region is formed directly below the third gate electrode and wherein the second source and drain regions do not overlap the third gate electrode.

7. The OLED display of claim 1, wherein the first gate electrode has a thickness of less than about 1000 Å.

8. The OLED display of claim 2, further comprising:
a second interlayer insulating layer formed over the second and third gate electrodes;
a plurality of data conductors formed over the second interlayer insulating layer;
a passivation layer formed over the data conductors;
a plurality of pixel electrodes formed over the passivation layer;
a pixel defining layer formed over the passivation layer and at least a portion of the pixel electrodes;
an organic light-emitting layer formed over the pixel electrodes; and
a common electrode formed over the organic light-emitting layer,
wherein the second interlayer insulating layer and the gate insulating layer define a plurality of contact holes,
wherein the passivation layer defines a plurality of contact holes,
wherein the data conductors pass through the respective contact holes to be electrically connected to the first source and drain regions, the second source and drain regions, and the pixel electrodes.

9. The OLED display of claim 8, wherein the first semiconductor layer and the first and second gate electrodes form a switching thin film transistor electrically connected to the data conductors and wherein the second semiconductor layer and the third gate electrode form a driving thin film transistor electrically connected to the organic light-emitting layer.

10. An organic light-emitting diode (OLED) display including a plurality of thin film transistors (TFTs), each TFT comprising:
a substrate;
a semiconductor layer formed over the substrate and including a first channel region, a source region, a drain region, and a lightly doped region formed between i) the first channel region and ii) the source and drain regions;
a first gate electrode formed directly over at least a portion of the semiconductor layer; and
a second gate electrode formed directly over at least a portion of the first gate electrode,
wherein the width of the second gate electrode is less than that of the first gate electrode,
wherein at least a portion of the lightly doped region overlaps the first gate electrode and does not overlap the second gate electrode.

11. The OLED display of claim 10, wherein the semiconductor layer further comprises:
a second channel region; and
an intermediate region,
wherein the lightly doped region is further located between i) the intermediate region and ii) the first and second channel regions,
wherein the first gate electrode comprises a pair of first gate electrodes respectively formed directly above the first and second channel regions, and
wherein the second gate electrode comprises a pair of second gate electrodes respectively formed directly above the pair of first gate electrodes.

* * * * *